United States Patent
Simola et al.

(10) Patent No.: US 6,538,436 B1
(45) Date of Patent: Mar. 25, 2003

(54) METHOD AND APPARATUS FOR ELIMINATING BACKGROUND INTERFERENCE SIGNALS FROM MULTICHANNEL SIGNAL MEASUREMENTS

(75) Inventors: Juha Simola, Helsinki; Juha Tuoriniemi; Matti Kajola, both of Espoo; Lauri Parkkonen; Antti Ahonen, both of Helsinki, all of (FI)

(73) Assignee: Neuromag Oy, Helsinki (FI)

( * ) Notice: Subject to any disclaimer, the term of this patent is extended or adjusted under 35 U.S.C. 154(b) by 0 days.

(21) Appl. No.: 09/382,069

(22) Filed: Aug. 24, 1999

(30) Foreign Application Priority Data

Aug. 28, 1998 (FI) .................................................. 981853

(51) Int. Cl.$^7$ .......................................... G01R 33/035
(52) U.S. Cl. ....................................... 324/248; 324/225
(58) Field of Search ................................. 324/202, 225, 324/248, 260, 244; 505/845, 846; 327/510, 527, 528, 590, 363

(56) References Cited

U.S. PATENT DOCUMENTS

| | | | |
|---|---|---|---|
| 4,761,611 A | | 8/1988 | Hoenig |
| 4,977,896 A | | 12/1990 | Robinson et al. |
| 5,020,538 A | | 6/1991 | Morgan et al. |
| 5,027,069 A | * | 6/1991 | Roehrlein .................... 324/225 |
| 5,187,436 A | | 2/1993 | Mallick |
| 5,657,756 A | | 8/1997 | Vrba et al. |
| 5,668,472 A | * | 9/1997 | Ohyu ......................... 324/248 |
| 6,339,328 B1 | * | 1/2002 | Keene et al. ................ 324/225 |

FOREIGN PATENT DOCUMENTS

| | | |
|---|---|---|
| DE | 4131947 | 4/1993 |
| DE | 4304516 | 9/1993 |
| EP | 90220 | 10/1983 |
| EP | 0481211 | 4/1992 |
| EP | 0 514 027 | 11/1992 |
| WO | WO 9317616 | 9/1993 |
| WO | WO 9412100 | 6/1994 |

OTHER PUBLICATIONS

"A Fast Fixed–Point Algorithm for Independent Component Analysis" Hyvärinen, et al. Neural Computation, vol. 9, pp. 1483–1492., 1997.

"Neural Networks" Haykin, Macmillam College Publishing Company: pp. 363–370., 1994.

"Magnetoencephalography—theory, instrumentation, and applications to non–invasive studies of the working human brain", Hamalainen, et al. Reviews of Modern Physics, vol. 65, No. 2., Apr. 1993.

"Design, Construction and performance of a Large–Volume Magnetic Shield" Kelha, et al. IEEE, vol. Mag–18, No. 1. Jan. 1982.

* cited by examiner

*Primary Examiner*—Jay Patidar
(74) *Attorney, Agent, or Firm*—Altera Law. Group LLC (57) ABSTRACT

A method and apparatus is described for making multichannel signal measurements of weak signals in noisy environments, wherein the elimination of background interference signals from the multichannel signal measurement is performed. The method is based on an adaptive compensation technique in which the large interfering background signals are first recorded. By a statistical analysis of this multichannel measurement, independent components of the interference are determined. The apparatus is provided with compensator elements which are coupled to individual sensors for both collection and distribution of information on the interference signals during the measurement. In this way the output of a device can be made immune to the large amplitude interference components present in the device's environment. This reduces the dynamic range requirement for the data transport and storage systems.

53 Claims, 4 Drawing Sheets

METHOD AND APPARATUS FOR ELIMINATING BACKGROUND INTERFERENCE SIGNALS FROM MULTICHANNEL SIGNAL MEASUREMENTS

FIELD OF THE INVENTION

The present invention relates to multichannel signal measuring. More particularly, the present invention relates to a novel and improved method for collecting multichannel signals comprising of the signal of interest and of superposed background interference contributions which may be much larger than the signal of interest.

DESCRIPTION OF THE RELATED ART

Performing many simultaneous measurements on a subject, i.e. multichannel detection, is sometimes essential in order to obtain sufficient information on the issue under examination. We consider, in particular, the detection of biomagnetic fields associated with the function of human brain or heart. Modern magnetometers for this purpose comprise about 100 channels to enable accurate localization of neuro- or cardiographic sources. Biomagnetic fields are very weak in comparison to the background magnetic fields in the surroundings, so that the problem of resolving the real signal from environmental interference is technically very challenging (M. Hämäläinen et. al., "Magnetoencephalography—theory, instrumentation, and applications to noninvasive studies of the working human brain", Rev. Mod. Phys. vol. 65, no 2 April 1993.).

Prior art of protecting very sensitive instruments against external interference include basically five methods: 1) use of passive shielding elements surrounding the instrument (magnetically shielded room in the biomagnetic application), 2) use of active elements canceling the interfering environmental signal (large scale compensation coils in magnetic measurements), 3) reducing the relative sensitivity of the sensors to typical background signals (use of gradiometers instead of magnetometers), 4) use of additional sensors to estimate the background interference in order to separate it out from the signals, and 5) numerical processing of the multichannel data to separate true signal from external interference.

In method 1), when applied to biomagnetic measurements, the instrument is placed inside a shielding room having walls made of high permeability metal alloy (mu-metal). In the low frequency range, relevant to biomagnetic signals, the shielding factor of such a room is limited to about 100–1000 by reasonable amount and finite permeability of mu-metal. At high frequencies the shielding may be improved by adding layers of highly conducting material, such as aluminium (V. O. Kelhä et. al., "Design, Construction, and Performance of a Large-Volume Magnetic Shield", IEEE Trans. on Magnetics, vol. MAG-18, no 1, January 1982.).

In studies of human subjects, possibly patients in a hospital, the magnetically shielded room has to be relatively large, leading to a heavy and expensive construction. Sufficient shielding requires multilayer structure with total wall thickness of about 0.6 m. Thus, the outer dimensions of the room must be on the order of 4 m×5 mm×3.5 m to provide enough space for the instrument and comfortable conditions for the patient on a bed, and possibly for medical personnel taking care of the patient. Especially, the need of 3.5 m in height (two floors) is inconvenient in a typical hospital environment.

Method 2), when large compensation coils are used (EP 0 514 027, M. Kazutake et al. "Magnetic noise reducing device for a squid magnetometer") resembles the passive shielding with high permeability material. The shielding current, which in mu-metal is generated as a natural response to an exposure to magnetic field, is now generated artificially in a control system and driven into coils with dimensions comparable to those of a typical shielded room. As a realization of such a system, three orthogonal Helmholtz pairs may be used. The external field to be eliminated is measured outside the coil system by field sensing elements, such as fluxgates, whose output is converted by a proper control system into electrical currents fed into the compensation coils. This kind of active shielding is far lighter and less expensive than a typical passive shield. It also performs best at low frequencies, where passive shielding of magnetic fields is most difficult.

The major disadvantage of method 2) is the very restricted geometry of the shielding currents. In practice, a compensation coil system can reject the field of distant sources only, which produce nearly uniform field at the site of the instrument. It may also be difficult to find the optimal positions for the field sensing elements, and if the environmental conditions change, the system may have to be readjusted.

Method 3), regarding the biomagnetic application, is based on the fact that the gradients of a magnetic field decrease more rapidly as a function of the distance from the source than the field itself. Therefore, the signal to background ratio is increased by measuring the difference of magnetic flux between two adjacent locations instead of the flux itself: the signal arising from the nearby object of study (e.g. a brain) is enhanced in comparison to the disturbance signal from an interfering source further away.

In principle, method 3) provides total immunity against uniform interference fields. In practice, however, the balance of best gradiometers is limited to at best 1/1000 because of technical difficulties in controlling the geometry of the sensors. In addition, the interfering fields are never strictly uniform. If the disturbing source is located a distance l away (typically 1–10 m) and the baselength of the gradiometer is h (typically 0.01–0.1 m), the background signal of the sensor is damped roughly by a factor of h/l compared to a magnetometer with the same loop size.

The most severe drawback of method 3) is that it rejects part of the signal arising from the object of study as well. This is especially unfavorable when the biomagnetic field is nearly uniform on the length scale of the sensor. This is to some extent the case in cardiac studies, and when a neuromagnetic source is located deep below the scull. For this reason, magnetometers would be preferred instead of gradiometers in many biomagnetic measurements (M. Hämäläinen et. al., "Magnetoencephalography—theory, instrumentation, and applications to noninvasive studies of the working human brain", Rev. Mod. Phys. vol. 65, no 2 April 1993).

In method 4) (U.S. Pat. No. 5,187,436 A, J. A. Mallick "Noise cancellation method in a biomagnetic measurement system using an extrapolated reference measurement", and U.S. Pat. No. 5,020,538, N. H. Morgan et al., "Low Noise Magnetoencephalogram system and method", and DE 4131947, G. M. Daalmans, "Mehrkanalige SQUID—Detektionseinrichtung mit Störfeldunterdrückung", and DE 4304516, K. Abraham-Fuchs, "Verfahren zum Bestimmen einer Characteristischen Feldverteilung einer ortsfesten Störquelle", and WO 93/17616, K. Abraham-Fuchs, "Disturbances suppression process during position and/or direction finding of an electrophysiological activity", and EP 0481 211, R. H. Koch, "Gradiometer having a magnetometer which cancels background magnetic field from other magnetometers", and U.S. Pat. No. 5,657,756, J. Vrba et al., "Method and systems for obtaining higher order gradiometer measurements with lower order gradiometers") the apparatus is equipped with additional background sensors, which are so arranged that they do not receive any substantial input from the object of study. They are usually placed further away from the actual sensor array. From the signals of these sensors an estimate of the interfering background field is calculated—for example up to the desired order in the Taylor expansion of the field—and then properly extrapolated and subtracted from the signals of the actual measuring channels.

The relatively large distance between the background sensors and the actual sensors and the inaccuracy in the calibration and relative location and orientation of the sensors are the main drawback of this method, because these factors limit the degree of achievable compensation. Especially, correct interpretation and use of the background sensor outputs is practically impossible, for example, if the background signal arises from an unknown vibration mode of the instrument in an unknown remanence field distribution.

In method 5) the signals collected by a multichannel device during a measurement are first stored on a memory device. After the measurement, the data are processed with a numerical template or projection method to separate out the contributions of the interesting biomagnetic sources from the disturbing interference fields (WO 94/12100, R. Ilmoniemi, "Method and apparatus for separating the different components of evoked response and spontaneous activity brain signals as well as of signals measured from the heart", and WO 93/17616, K. Abraham-Fuchs, "Disturbances suppression process during position and/or direction finding of an electrophysiological activity", and U.S. Pat. No. 4,977,896, S. E. Robinson et al., "Analysis of biological signals using data from arrays of sensors").

Method 5) relies on the multichannel aspect of the measuring device: only by collecting data from many sensors simultaneously can the background interference be separated from the true signal due to their characteristically different distribution over the entirety of channels. In a neuromagnetic measurement, for example, the sensors should cover the whole head.

When used with magnetometers method 5) requires very large dynamic range for every channel of the data collection system, since the actual biomagnetic signal can be contaminated by a background signal several orders of magnitude larger. One would effectively have to subtract large but nearly equal numbers from each other to reveal the differences representing the actual biomagnetic activity.

In practice, the strength of biomagnetic fields is 6–8 orders of magnitude weaker than the unshielded background fields in a typical environment. (M. Hämäläinen et. al., "Magnetoencephalography—theory, instrumentation, and applications to noninvasive studies of the working human brain", Rev. Mod. Phys. vol. 65, no 2 April 1993). Therefore, at least two of the above methods have to be combined to achieve a tolerable signal to background ratio.

In the present invention a multichannel sensor device is made immune to environmental interference by cross coupling the channels in such a way that there is no output in response to the interference. No extra compensation or reference channels are necessary. In practice it turns out that the shielding efficiency of the present method is proportional to the number of cross coupled channels and therefore the present method where all or most of the signal channels participate the compensation is superior to prior art methods which utilize a smaller number of separate compensation channels (e.g. U.S. Pat. No. 5,657,756, J. Vrba et al., "Method and systems for obtaining higher order gradiometer measurements with lower order gradiometers").

Ordinarily, when N channels are operated in parallel, the output of each channel depends on the input of its own sensor only. This can be described by a diagonal N×N matrix C, by which the N-dimensional output vector U is obtained as $$U = Cu$$

for a given N-dimensional input vector u. The element $C_{ii}$ of the coupling matrix is the gain, or the calibration constant, of the respective channel i.

The present compensation method is described by a non-diagonal matrix C, whose off-diagonal components represent the cross couplings between the channels. This matrix is constructed so that it maps to null vector all the input vectors interpreted as interference; the required linear mapping C in N-dimensional signal space has n-dimensional null-space, where n is the number of independent interference vectors, or field distributions, spanning the subspace called interference signal space. In practical applications n<<N.

The prior art invention WO 94/12100 (R. Ilmoniemi, "Method and apparatus for separating the different components of evoked response and spontaneous activity brain signals as well as of signals measured from the heart") describes a signal space method where different biomagnetic responses are separated from each other and from interference originating from uninteresting sources by applying signal space projection methods to collected data. Typical interference signals—especially in the case of magnetometers—may be by factor 10000 or 1000000 larger than the signals of interest. Therefore the aforementioned prior art method would require data collection and storage with too much extra dynamic range to be practical.

The required cross-coupling strengths for the sensor network in the present method are determined from a measurement of the interference seen in the absence of the cross couplings. For the determination of the cross coupling strengths no detailed information on the location, orientation, or calibration of individual channels or their relative locations and orientations is required. Full compensation of an N-channel system can be accomplished by 2Nn cross couplings, when the couplings are realized by negative feedback. In practice even a lower number of couplings may be sufficient.

When performing a measurement with the compensated system the magnitudes of the background interference signal components in the interference signal space are recorded together with the compensated signals and, if required, the uncompensated signals can be recovered from this information with a linear transformation.

The use of the present method in the biomagnetic application is in a way analogous to using a shielded room: The sensors of the multichannel magnetometer detect the interference due to the field in the magnetically shielded room and n "shielding currents" are constructed from this information and then delivered, properly weighted, to the individual channels in form of negative feedback. This negative feedback is superimposed on the ordinary negative feedback used to drive the magnetometer channels in the flux locked loop. The same feedback coils used for the flux locking negative feedback can be used to feed in the shielding currents as well.

As to prior art methods 1) and 3) the invention effectively improves magnetic shielding and thus enables to use sensitive magnetometer sensors instead of gradiometers in a standard shielded room. The present method for eliminating the interference is adaptive to the conditions present at a particular site, since the cross couplings are chosen to cancel the interference measured by the very sensor array itself. The effective shielding factor so achieved is comparable to that of the best balanced gradiometers of the date.

As to prior art method 2) the present invention offers more flexible adaptive shielding. The N negative feedback coils of the individual channels replace the small number of large, fixed geometry external compensation coils of method 2). In our method the compensation currents have no interaction with the walls of the shielding room. Also, any vibration of the magnetometer array in the remanence field is impossible to handle with a set of external compensation coils but in the present method it is simply an extra dimension in the interference signal space.

As to prior art method 4) the present invention offers several advantages: No extra compensation or reference sensors are necessary. For successful compensation there is no need to accurately calibrate or balance sensors or to make any sensors parallel or orthogonal to each other. Neither is the compensation limited to any order in the Taylor expansion of the interfering magnetic field. In the present method the interference is simply compensated up to any order necessary; the degree of compensation achieved depends only on how accurately the devices used for setting the cross coupling strengths can be set. The degree of achievable compensation is also proportional to the number of channels participating in the cross coupled network. In the present method this number can be freely chosen and can be increased up to the total number of channels in the device (N) instead of the relatively limited number of separate compensation channels used in the prior art compensation schemes. A standard compensation obtained by adding or subtracting a reference signal increases the noise in the signals. Such increase of noise is absent from the present method because the linear mapping C is a projection.

A reduction in the number of actual measurement channels takes place in method 4) when out of the N sensors of the system n are chosen permanently to be compensation sensors and moved further away from the source of the actual signals. The present method is more flexible at this point because the number of compensated interference modes n can be chosen according to the needs dictated by the environment and the quality of the shielded room.

Also, in method 4) the quality of compensation may suffer if any one of the n compensators does not work properly. In the present this problem is absent because the individual channels are equal and a malfunctioning channel can simply be disconnected from the feedback network (and discarded from the data).

As to prior art method 5) the advantage is that no sensors or data collection devices with excess dynamic range are needed. The "shielding currents" created in the cross coupled sensor network are distributed to balance all the N sensors against the interference.

SUMMARY OF THE INVENTION

The object of the present invention is to eliminate the problems and the disadvantages described above.

A specific object of the present invention is to disclose a completely new type of method and device for eliminating background interference from multichannel signal measurement.

The approach of the present invention can be used in conjunction with measurements by any multichannel device, susceptible to environmental interference. The preferred embodiment is directed toward an application for biomagnetic measurements: magnetoencephalography (MEG) and magnetocardiography (MCG). The method, however, is more generally applicable, as long as the environmental background signal has sufficiently different characteristics from the signal of interest. This condition can usually be fulfilled by a properly arranged sensor array with a sufficiently large number of channels. For example, in neuromagnetic measurements this is accomplished by a whole head coverage with about 100 sensors.

BRIEF DESCRIPTION OF THE DRAWINGS

In the following, the invention and its advantages are explained in more detail with reference to the attached drawings, in which.

DETAILED DESCRIPTION OF THE PREFERRED EMBODIMENTS

The present invention is most easily described by means of a highly oversimplified example, which, however, is straightforwardly generalized to apply in actual practical implementations. Therefore, we consider a device with only two sensors; let them be magnetometer loops for clear visual interpretation, see FIG. 1. Let these loops, (1 and 2), be in the same plane, let the interference be a uniform field in arbitrary direction, and let the signal of interest arise from a current-dipole like source (3) causing the magnetic fluxes $\phi_1$ and $\phi_2$ through the two loops.

Figure 1:
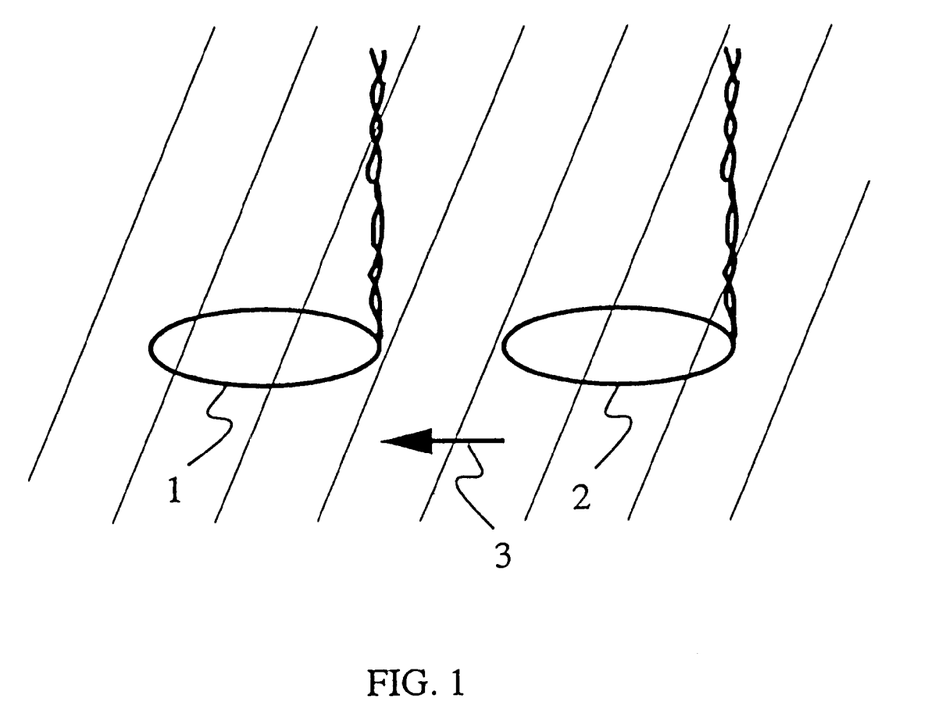
FIG. 1 presents a schematic illustration of a simplified sensor arrangement in a multichannel measurement.

The input vector u is the sum of the uniform background flux $\phi_0$ penetrating both loops plus the contributions of the source of interest, $\phi_1$ and $\phi_2$. When the two channels are read separately, i.e. the system is diagonal, the matrix C is a 2×2 unit matrix multiplied by an overall calibration constant $C_0$. The input vector $u=(\phi_0+\phi_1, \phi_0+\phi_2)$ results in the output vector $U=Cu=C_0(\phi_0+\phi_1, \phi_0+\phi_2)$. If the background is very large compared to the actual signal of interest, the output is dominated by the interference and the actual signal from the dipole can not be resolved unless the sensors have a very large dynamic range.

However, if the coupling matrix is modified to $$C = C_0/2 \begin{pmatrix} 1 & -1 \\ -1 & 1 \end{pmatrix},$$

we obtain $U=(C_0/2)(\phi_1-\phi_2, -\phi_1+\phi_2)$ for the same input vector as above. Now the device is made completely insensitive to the large uniform interference field and the response is only due to the dipole source. The price paid for this convenience is that the two signals have become linearly dependent (equal but of opposite sign). For large sensor arrays this is not a problem, since compensation of n independent interference components from the signals of N channels reduces the number of independent signals to N−n. When N>>n, there is no essential loss of signal dimensionality.

Figure 2:
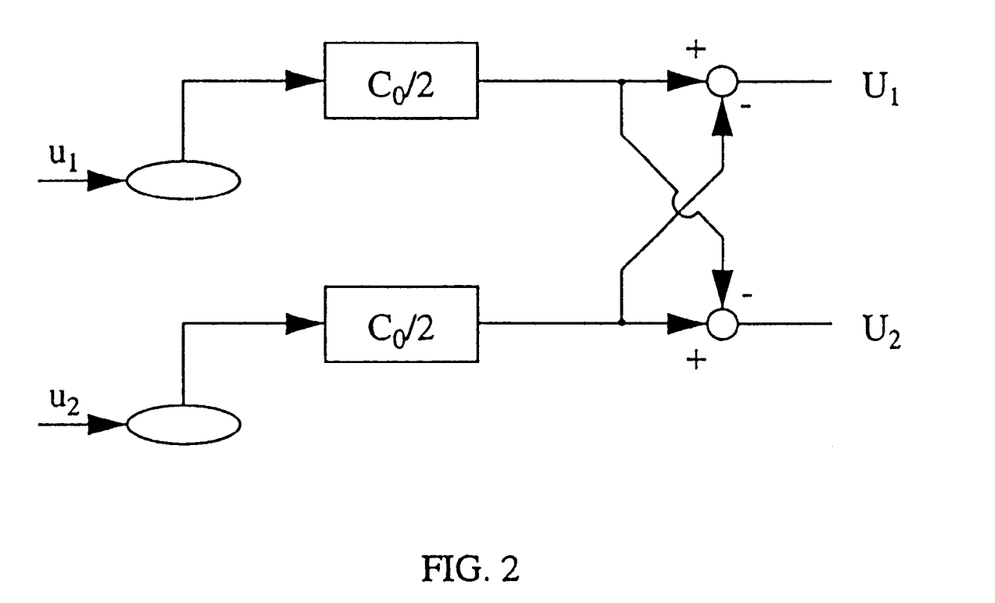
FIG. 2 presents a schematic illustration of a signal processing in a simple cross coupled multichannel device.

The non-diagonal couplings mean that the input of each channel contributes to not only the output of the channel itself but also to that of the other channels. The parallel, independent sensors of a conventional device are thus transformed into an integrated sensor network. This is illustrated in FIG. 2.

The example above can be generalized to a device of N magnetometer loops, all laying still in the same plane for simplicity. A signal in response to a uniform background field is expelled by using an N×N coupling matrix $$C = C_0/N \begin{pmatrix} N-1 & -1 & \cdots & -1 \\ -1 & N-1 & \cdots & -1 \\ \vdots & \vdots & \ddots & \vdots \\ -1 & -1 & \cdots & N-1 \end{pmatrix} \quad (1)$$

Here, the output signal of each channel consists of the diagonal input, weighted by (N−1)/N, and of the (N−1) contributions with weights −1/N from all the other channels.

In this scheme a multichannel device with N sensors is compensated against an external disturbance by making $N^2$ cross couplings. It would become exceedingly complex and expensive to realize such an amount of cross couplings for systems consisting of about 100 channels. This complication is avoided when the cross couplings are made as described in the present invention.

When the two channels in the example above are operated in a negative feedback loop, they may be cross coupled to receive feedback also from each other $$\begin{cases} U_1 = G_1(u_1 + U_1/K_{11} + U_2/K_{12}) \\ U_2 = G_2(u_2 + U_1/K_{21} + U_2/K_{22}) \end{cases}.$$

As in ordinary negative feedback the forward gain is assumed to be virtually infinite i.e., $G_1, G_2 >> K_{ij}$; $i, j = \{1, 2\}$, and we end up with a matrix relation $u = -kU$, where the matrix $k$ has the elements $1/K_{ij}$. The output vector is $U = -k^{-1}u$, i.e. the linear mapping C above is defined by the matrix $-k^{-1}$.

The uniform background interference is canceled from the two channels when the non-diagonal couplings are chosen to give $$k^{-1} = K_0/2 \begin{pmatrix} 1 & -1 \\ -1 & 1 \end{pmatrix}.$$

This matrix, however, is singular. Consequently, no realizable negative feedback couplings exist, because they are determined by the inverse of the coupling matrix.

This problem can be overcome by the present method. A "virtual channel" or element is added to the system. This channel has no actual sensing element; it simply acts as a stage collecting and distributing the feedback between the real channels and appears as an additional component in the signal vector. In the following, this channel will be called the compensator channel. The compensator's output ($U_1$ in FIG. 3) is actually proportional to the projection of the input vector on the interference signal space and can be recorded and stored 7 along with the compensated signals of the proper channels. Within this scheme, the proper feedback matrix k in the above case of two magnetometers is $$k = 1/K_0 \begin{pmatrix} 0 & 1 & 1 \\ 1 & 1 & 0 \\ 1 & 0 & 1 \end{pmatrix}.$$

The first component of the signal vector corresponds to the compensator channel. With the corresponding coupling matrix $$k^{-1} = K_0/2 \begin{pmatrix} -1 & 1 & 1 \\ 1 & 1 & -1 \\ 1 & -1 & 1 \end{pmatrix}$$

one can verify the desired result. The background input vector is now $u=(0,1,1)\phi_0$ (the compensator channel gets no input except from the other channels). The interference is not seen in the output of the actual signal channels; it is displayed in the compensator channel only: $U=-k^{-1}(0,1,1)\phi_0 = -K_0(1,0,0)\phi_0$.

The advantage of the cross-coupling scheme realized by using the compensator channel (or element) becomes apparent when the number of channels is increased. In the case of N magnetometer loops in a plane, a uniform background is expelled from the measuring channels with the scarce (N÷1)×(N÷1) feedback matrix $$k = 1/K_0 \begin{pmatrix} 0 & 1 & 1 & 1 & \cdots & 1 \\ 1 & 1 & 0 & 0 & \cdots & 0 \\ 1 & 0 & 1 & 0 & \cdots & 0 \\ 1 & 0 & 0 & 1 & \cdots & 0 \\ \vdots & \vdots & \vdots & \vdots & \ddots & \vdots \\ 1 & 0 & 0 & 0 & \cdots & 1 \end{pmatrix} \quad (2)$$

Couplings are needed only to and from the compensator channel. Instead of the N(N−1)=9900 couplings between 100 channels it suffices now to make 2N=200 cross couplings.

Figure 3:
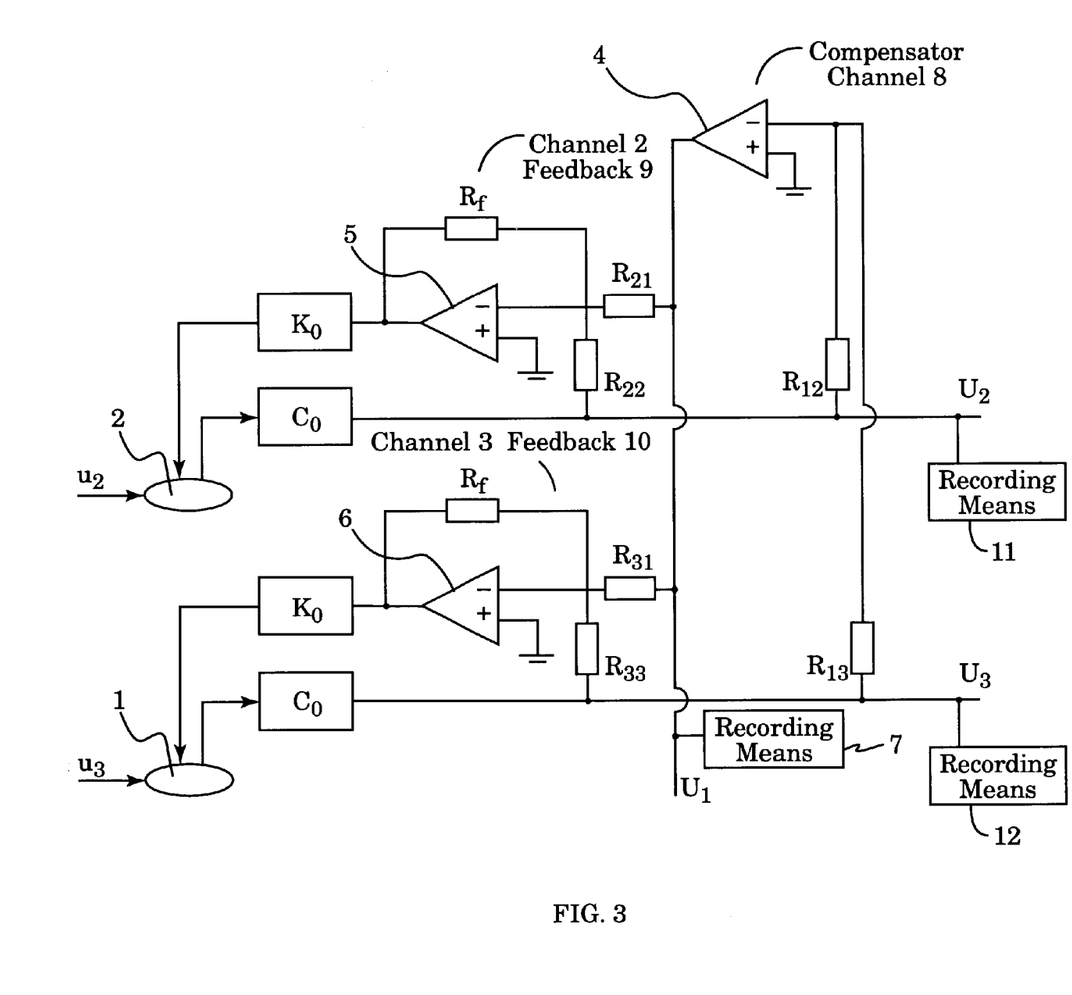
FIG. 3 presents a schematic illustration of a two measuring channels and a compensating channel with a negative feedback network realized by means of an operational amplifier.
Figure 4:
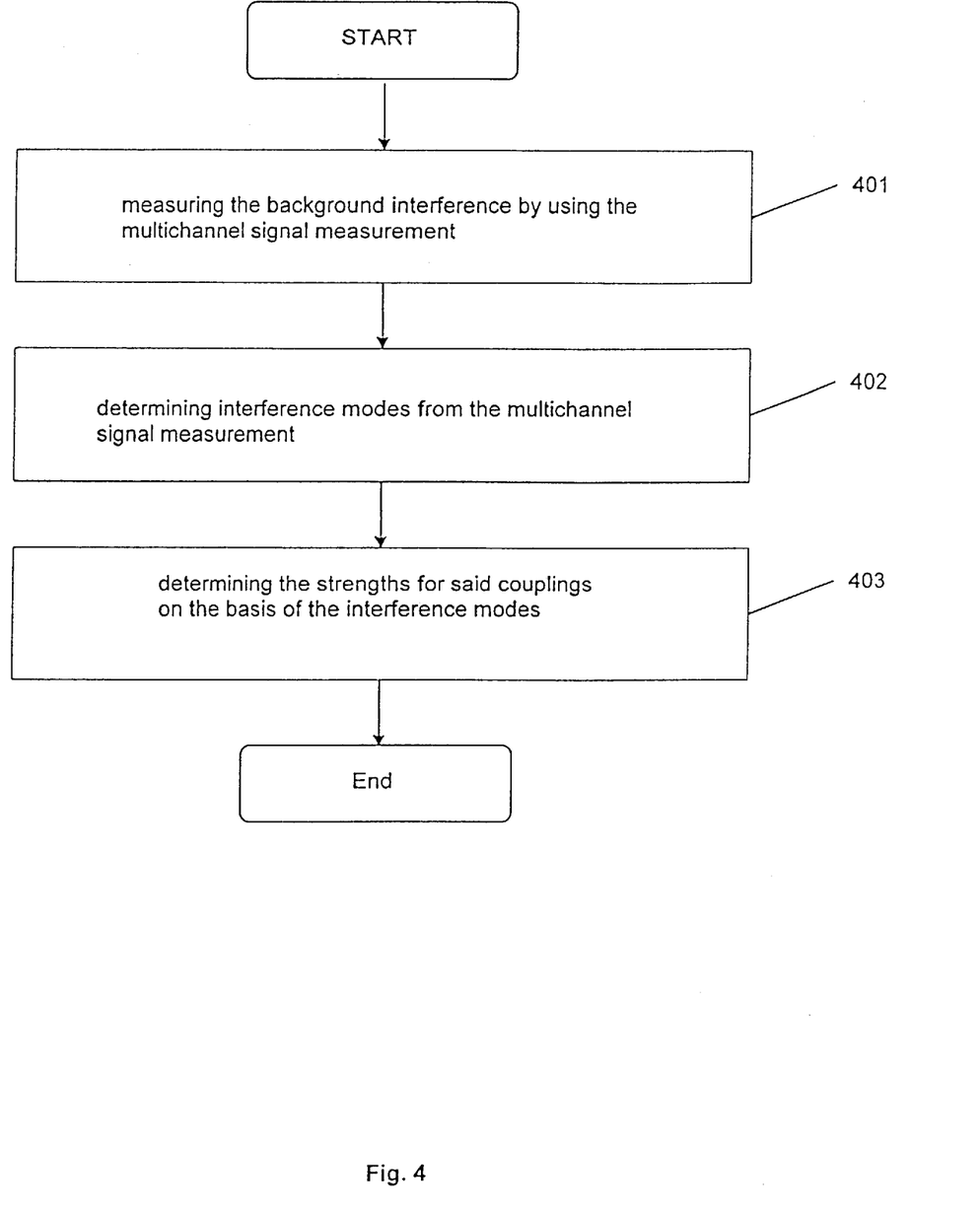
FIG. 4 presents a flow chart of the adjustment procedure for cross coupling strengths.

The compensator channel 8 can be realized, for example, by a simple adding operation amplifier 4, as illustrated in FIG. 3. The output of each real channel is connected to the input of the said amplifier 4, the output of which is connected again to the feedback line of each channel 9, 10. Each channel's own negative feedback and the cross coupling feedback from the compensator channel 8 are added up, for example by another operation amplifier (5 and 6), and coupled to the sensor elements (1 and 2) via the respective feedback coils. In this realization the elements of the feedback matrix, i.e. the cross-coupling constants, are determined by the input resistors $R_{12}$, $R_{13}$, $R_{21}$, $R_{31}$ of the of the operation amplifiers. The "forward couplings", i.e. the off-diagonal elements on the first row of the feedback matrix, are scaled by the inverse of the resistors $R_{12}$ and $R_{13}$; the "reverse couplings", i.e. the off-diagonal elements on the first column of the feedback matrix, are scaled by the inverse of resistors $R_{21}$ and $R_{31}$. The overall scaling of the matrix elements is determined by the feedback resistors $R_f$. They are preferably identical for each channel, but even if they are not, the adaptive nature of the present background elimination scheme will take care of that also.

The possibility to use information gathered with a large number of magnetometers (N)—instead of the information collected with just a small number of reference channels—is advantageous for the present interference compensation scheme. This becomes obvious when looking at the frequency dependent responses. Assuming that the bandwidths of the cross-coupling operational amplifiers ((1) in FIG. 3) are given by $G_c=-1/i\omega\tau_c$, and the transfer function of the diagonal feedback loop is given by $G/K=-1/i\omega\tau$, the output of the actual channels in response to an input signal $u_s$ is $$U_i=+K/(1+i\omega\tau)u_s,$$

and the output in response to the interference $$U_i=-K/(1-i\omega\tau+N/(i\omega\tau_c))u_0. \quad (3).$$

The response of actual channel to signal is unaffected by the compensator whereas the response to low frequency interference ($\omega<<\tau^{-1}, \tau_c^{-1}$) is reduced by an effective shielding factor $S=u_0/U_i=N/(K\omega\tau_c)$ which is proportional to N. A large number of channels involved in the compensated sensor network implies high rate of compensation.

According to Equation (3) the compensation system is least effective at $\omega=(N/(\tau\tau_c))^{1/2}$ where the shielding factor achieves a minimum value $S_{min}=(1+4N\tau/\tau_c)^{1/2}$. The minimum is pushed beyond the measurement band ($w\sim 1/\tau$) by a factor $(N\tau/\tau_c)^{1/2}$, and even at the minimum the shielding factor is of the order $(4N\tau/\tau_c)^{1/2}$. Thus, from this point of view a large number of channels in the compensation network is essential.

The conclusions above on the time dependent response of the compensated system remain the same even if the channels are unidentical—only the analytic formulae become more complex.

The generalization of the above compensation scheme to an arbitrary sensor arrangement and to any spatial form of interfering field is straightforward. Only the couplings, of strength unity above, are changed to values between −1 and +1 which—in the case of magnetometers—describe the projections of the magnetometer loop area along the direction of the interference field. Also, in the general case the number of compensated interference modes, i.e. the dimensionality of the interference signal space, must be increased beyond one used in the examples above. When the sensors of the array have arbitrary orientation—instead of being coplanar—even the compensation of an arbitrary uniform interfering field requires compensation of three components of the magnetic field (n=3).

In a practical application, that is in a real shielded room, it is, however, not necessary to compensate the multichannel system against any ideal field distribution—like the uniform field, or the five independent first derivatives of the field etc. (see prior art; U.S. Pat. No. 5,657,756, J. Vrba et al., "Method and systems for obtaining higher order gradiometer measurements with lower order gradiometers"). The essential need is to compensate against those field distributions observed to arise in the shielded room in response to the typical magnetizing events in the neighbourhood of the very room in question. If the room is located reasonably far from the major interference sources (streets, railways, elevators) the response of the room consists of three independent interference field distributions corresponding to the three components of the approximately uniform magnetizing field outside the room. These field distributions are practically never uniform inside the shielded room.

The actual number of compensator channels is chosen according to the number of interference modes that require compensation. If the external field magnetizing the shielding room is essentially in one direction even one compensator may be enough. On the other hand if the walls of the shielded room or the magnetometer are vibrating, or if there are interfering signals arising from sources inside the shielded room (cardiac signal of the subject, or signals from electrical devices) the compensation of these interference components is done by adding one compensator channel per interference mode.

The method for determination of the cross-coupling weights, in a specific environment is an important aspect of the present invention. This is done by the sensor array itself without the cross couplings. No preknowledge of the nature of the interference is needed. The compensation is tuned to work in the conditions of the particular installation of the multichannel device.

The interference signal is recorded in an empty shielded room with the door closed for typically a couple of minutes and a statistical analysis such as principal component analysis (PCA, see for example S. Haykin, Neural Networks, Macmillan College Publishing Company, pp. 363–394, 1994) or independent component analysis (ICA, see e.g. A. Hyvärinen and E. Oja, "A fast fixed-point algorithm for independent component analysis", Neural Computation, vol. 9, pp. 1483–1492, 1997) is made on this data. The dominant principal components of this empty room recording give a set of orthogonal basis vectors of the interference signal space. Prior to setting the cross couplings a numerical signal space projection (SSP, WO 94/12100, R. Ilmoniemi) method can be applied to verify the number of interference components necessary to compensate, so that the interference contribution in the output signal is acceptably small.

In the vicinity of the shielded room there usually exists a dominant source of interference causing a magnetizing field essentially in one direction. Therefore, the dominant interference mode found in the empty room signal PCA may well be an order of magnitude stronger than the next, weaker modes still to be compensated. In this situation, it may be practical to compensate some linear combinations of these principal components in order to load the compensator channels more evenly and to gain more dynamic range. Two modes, $c_1$ and $c_2$, can be combined to $(c_1+c_2)/\sqrt{2}$ and $(c_1-c_2)/\sqrt{2}$, for example, which retains their orthonormality.

In practice, the adjustment of the coupling constants in a large scale system with about 100 channels must be computer controlled. Without direct readout of the set cross-coupling values, there must be means for checking the status of these couplings. This is necessary both for the success of the interference rejection and for the correct interpretation and analysis of the signals collected with the compensated device. After the cross-couplings have been set the actual coupling matrix can be verified column by column by exciting each channel at a time (including compensator channels). This corresponds to an input vector with just one element different from zero. In an ordinary uncompensated magnetometer array the hardware necessary for exciting one channel at a time already exists for tuning purposes. A standard way is to use the feedback coil of the channel for this purpose. Due to the cross couplings in a compensated system, the excitation of one channel alone generates an output signal to the other channels as well. The output vector produced by exciting i:th channel is directly proportional to the i:th column of the cross-coupling matrix.

If the actual cross-coupling matrix K which has been determined with the above method is found to differ from the desired cross-coupling matrix k it is corrected by making the element by element corrections $\Delta_{ij}=(k_{ij}-[K^1]_{ij})/[K^1]_{ij}$, where j={n+1, n+N} for i={1, n} and j={1, n} for i={n+1, n+N}; $[K^1]_{ij}$ denotes the ij:th element of the inverse matrix of K.

This procedure can be repeated until the compensation result is satisfactory. As a rule of thumb, to compensate an interference signal by an effective shielding factor S, the cross-couplings between the channels have to be set with a relative precision of $S^{-1}$.

Once the cross-couplings have been set, there is also a quicker way to check them at any time against accidental changes. A practically sufficient brief check is to measure the n×n submatrix by exciting and reading the compensator channels only. This submatrix must be a diagonal matrix $N^{-1}I$, when the coupling vectors $n_i$ are scaled as above, and the compensated interference vectors are orthonormal linear combinations of the principal components of the empty room recording. An unintended change in any feedback connection results in appearance of a non-zero off-diagonal element in the n×n submatrix.

To ensure unbiased analysis of data recorded with the multichannel device such a brief or full check of the cross couplings can be routinely made in the beginning or end of the measurement.

The cross coupling strengths used to reject an interference component in the present method can be chosen in many different ways. It is not necessary to include all the channels in the compensation network. One can leave out the "forward" couplings (resistors $R_{12}$, $R_{13}$ in FIG. 3) of any subset of channels. This allows one to prevent occasional noisy channels from distributing their noise throughout the compensated network.

An other way to utilize this freedom is associated with the use of a reference subsystem of channels dedicated for compensation as in the prior art method 4. Although the method of this invention does not require such a subsystem it is still possible and in some situations useful to use one. In the present method these reference channels are treated in the same way as the actual measuring channels. In a case where the actual signal closely resembles an interference signal distribution in the measuring channel array (signal vector has a considerable projection on the interference signal space) it may be advantageous to use for the identification of the interference only the reference sensors which are immune to actual signals because they are typically located some distance away from the source of actual signals. On the other hand if there is a local disturbance seen by the reference channels only—noisy reference channel or vibration of the reference channel array, for example—the reference channels can be left out from the group of channels identifying the interference to prevent them from erroneously feeding the local disturbance into the measuring channels as a correction.

The actual cross-coupling matrix, which can be verified by experiment as described above, completely characterizes the state of the compensated multichannel device. It contains all the information about the system necessary for regeneration of the original uncompensated signals, if desired, from the measured data. Therefore, as regarding the data analysis, there are no complications even if the actual cross-couplings during the measurement would differ from the ones required for the ideal interference compensation.

In summary, the approach of the invention enables to use sensitive magnetometer sensors for biomagnetic measurements instead of gradiometers, conventionally used to exclude environmental background interference. Although this particular embodiment of the invention has been described in detail for purposes of illustration, the same cross-coupling method can be used to make any type of N-channel detector system immune to an external interference that is confined to a low dimensional subspace (n<N) of the signal space.

What is claimed is:

1. A method for eliminating background interference from multichannel signal measurement, comprising:

cross coupling outputs of at least two signal channels into a feedback stage of said at least two signal channels before the output of said at least two signal channels, and minimizing background interference from the output of said at least two signal channels by the feedback stage.

2. The method as defined in claim 1, wherein minimizing background interference further comprises:

coupling a compensating channel between the outputs of said at least two of said signal channels and the feedback stage of said at least two signal channels before the output of said at least two signal channels.

3. The method as defined in claim 2, wherein a number of compensating channels equals a number of interference modes to be eliminated.

4. The method as defined in claim 2, wherein the output of said compensating channel is recorded as a function of time.

5. The method as defined in claim 2, wherein a strength for coupling the output of said at least two signal channels to said compensating channel is adjusted according to an adjustment procedure.

6. The method as defined in claim 5, wherein the strength for coupling said compensating channel into the feedback stage of said at least two signal channels before the output of said at least two signal channel is adjusted according to the adjustment procedure.

7. The method as defined in claim 6, wherein the adjustment procedure comprises measuring background interference, determining interference modes from said measurement, and determining strengths for said coupling on the basis of the interference.

8. The method as defined in claim 7, wherein said strengths are determined by measuring the interference without said cross coupling.

9. The method as defined in claim 7, wherein said strengths are determined by measuring the interference without an object of study.

10. The method as defined in claim 7, wherein said strengths are determined by statistical analysis.

11. The method as defined in claim 7, wherein said strengths are determined by principal component analysis.

12. The method as defined in claim 7, wherein said strengths are determined by independent component analysis.

13. The method as defined in claim 7, wherein said strengths are verified by exciting a single signal channel at a time.

14. The method as defined in claim 1, wherein a signal channel of the at least two signal channels is disconnected from said cross coupling if the signal channel malfunctions.

15. The method as defined in claim 1, wherein the output of said at least two signal channels are recorded as a function of time.

16. The method as defined in claim 1, wherein the output of said at least two signal channels are added with an output of a compensating channel thus enhancing the output of said at least two signal channels.

17. The method as defined in claim 1, wherein the measured signal is a biomagnetic signal from a neuro- or cardiographic source.

18. The method as defined in claim 1, wherein said at least two signal channels are measured by a SQUID-magnetometer.

19. A multi-channel magnetometer for measuring biomagnetic signals provided with a set of separate channels for interference compensation, and eliminating background interference as described in claim 1, wherein elements providing the cross coupling between sensor channels get their input as a weighted linear combination from a selectable but arbitrary subset of the totality of all channels in order to compensate any dominant interference mode.

20. The device described in claim 19, wherein said weights for each channel contributing to the input of the cross coupling elements are chosen in an optimal way based on a statistical analysis of the noise level of each channel.

21. The method for measuring biomagnetic signals with a multi-channel magnetometer provided with a set of separate channels for interference compensation, and eliminating background interference as described in claim 1, wherein elements providing the cross coupling between signal channels get their input as a weighted linear combination from a selectable but arbitrary subset of the totality of all channels in order to compensate any dominant interference mode.

22. The method described in claim 21, wherein said weights for each channel contributing to the input of the cross coupling elements are chosen in an optimal way based on a statistical analysis of the noise level of each channel.

23. A multichannel signal measuring device, comprising:
a plurality of signal channels provided with sensors, and
means for cross coupling outputs of at least two of the plurality of signal channels into a feedback stage of the at least two of the plurality of signal channels before the output of said at least two of the plurality of signal channels in order to minimize background interference from the measurement by the feedback stage.

24. The measuring device as defined in claim 23, wherein said device further comprises
a compensating channel between the outputs of at least two of the plurality of signal channels and the feedback stage of the at least two of the plurality of signal channels before the output of the said at least two of the plurality of signal channels,
a first coupling element for coupling the output of said at least two of the plurality of signal channels to said compensating channel, and
a plurality of second coupling elements for coupling said compensating channel to the feedback stages of said at least two of the plurality of signal channels before the output of said at least two of the plurality of signal channels.

25. The measuring device as defined in claim 24, wherein said first coupling element comprises means for adjusting a strength for coupling the output of said at least two of the plurality of signal channels into said compensating channel according to an adjustment procedure.

26. The measuring device as defined in claim 25, wherein said plurality of second coupling elements comprise means for adjusting the strength for coupling said compensating channel into the feedback stage of the at least two of the plurality of signal channels before the output of said at least two of the plurality of signal channels according to the adjustment procedure.

27. The measuring device as defined in claim 26, wherein said adjustment procedure comprises means for
measuring background interference,
determining interference modes from said measurement, and
determining strengths for said coupling on the basis of the interference.

28. The measuring device as defined in claim, 22 wherein said device comprises means for determining said strengths by measuring the interference without said cross coupling.

29. The measuring device as defined in claim 22, wherein said device comprises means for determining said strengths by measuring the interference without an object of study.

30. The measuring device as defined in claim 22, wherein said device comprises means for determining said strengths by statistical analysis.

31. The measuring device as defined in claim 22, wherein said device comprises means for determining said strengths by principal component analysis.

32. The measuring device as defined in claim 22, wherein said device comprises means for determining said strengths by independent component analysis.

33. The measuring device as defined in claim 27, wherein said device comprises means for verifying said strengths by exciting a single channel at a time.

34. The measuring device as defined in claim 24, wherein said device comprises equal number of said compensating channels and interference modes to be eliminated.

35. The measuring device as defined in claim 24, wherein said device comprises means for recording the output of said compensating channel as a function of time.

36. The measuring device as defined in claim 23, wherein said device comprises means for disconnecting a signal channel of the plurality of measuring channels from said cross coupling if the signal channel malfunctions.

37. The measuring device as defined in claim 23, wherein said device comprises means for recording the output of said signal channel as a function of time.

38. The measuring device as defined in claim 23, wherein said device comprises means for adding the output of said signal channel with the output of the compensating channel thus enhancing the output of said signal channel.

39. The measuring device as defined in claim 23, wherein the measured signal is a biomagnetic signal from a neuro- or cardiographic source.

40. The measuring device as defined in claim 23, wherein said device comprises a SQUID-magnetometer.

41. A method for collecting multichannel signals including a signal of interest and of superposed background interference contributions which is substantially larger than the signal of interest, comprising:
providing a multichannel measuring device with one or several elements that cross couple all or part of signal channels before the readout of the signal channels output, wherein the output of the signal channels in response to background interference can be made zero while information concerning background interference is recorded.

42. The method for cross coupling the signal channels of a multichannel device as defined in claim 41, wherein cross coupling strengths between the signal channels and said elements are determined from a measurement of the background interference made with said multichannel device.

43. The multichannel device having mutually cross coupled signal channels according to claim 42, wherein the signal channels and cross coupling elements can be excited individually for the purpose of checking and readjusting said cross coupling strengths.

44. The method as described in claim 41, wherein cross coupling strengths between the signal channels of the device are obtained by applying principal component analysis or independent component analysis, or any other method of statistical analysis on said measurement of the background interference.

45. The multichannel device utilizing the cross coupling method described in claim 41, wherein the elements that record the background interference and cross couple the signal channels before readout of the signal channels output are components in an analog electronic circuit, said components in an analog electronic circuit obtaining input from and contributing to the output of the channels that the components in an analog electronic circuit cross couple.

46. The multichannel device utilizing the cross coupling method described in claim 41, wherein the elements that record the background interference and cross couple the signal channels before readout of the output are registers in a digital signal processor, said registers obtaining input from and contributing to the output of the channels that they cross couple.

47. The multichannel device according to claim 46, wherein feedback providing the cross coupling is summed with negative feedback from each of the signal channels.

48. The multichannel device utilizing the cross coupling method described in claim 41, wherein the data on the state of the cross coupling elements as a function of time is collected simultaneously with the output data from the channels and stored on a memory device along with the output data.

49. A multi-channel magnetometer for measuring biomagnetic signals provided with a set of separate channels for interference compensation, and eliminating background interference as described in claim 39, wherein elements providing the cross coupling between signal channels get their input as a weighted linear combination from a selectable but arbitrary subset of the totality of all signal channels.

50. The device described in claim 49, wherein said weights for each signal channel contributing to the input of the cross coupling elements are chosen in an optimal way based on a statistical analysis of the noise level of each signal channel.

51. The multichannel device utilizing the cross coupling method described in claim 41, wherein the elements that record the background interference and channels that cross couple the signal channels before readout of the output include analog electronic circuit components, said components obtaining input from and contributing to the output of the channels that the cross couple, and characterized in that the channels that cross couple provide negative feedback between the signal channels, said negative feedback being mediated by said components.

52. The device utilizing the method of claim 44, wherein the number of elements activated to provide the cross couplings can be chosen on the basis of said statistical analysis.

53. The device utilizing the method of claim 44, wherein the elements activated to provide the cross couplings can be chosen to correspond to an arbitrary linear combination of the principal components of interference found in said statistical analysis.

* * * * *